US008715519B2

(12) United States Patent
Harrington

(10) Patent No.: US 8,715,519 B2
(45) Date of Patent: May 6, 2014

(54) PLASMA REACTOR WITH ADJUSTABLE PLASMA ELECTRODES AND ASSOCIATED METHODS

(71) Applicant: Micron Technology, Inc., Boise, ID (US)

(72) Inventor: Daniel Harrington, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/774,772

(22) Filed: Feb. 22, 2013

(65) Prior Publication Data

US 2013/0164941 A1 Jun. 27, 2013

Related U.S. Application Data

(62) Division of application No. 12/210,724, filed on Sep. 15, 2008, now Pat. No. 8,382,941.

(51) Int. Cl.
*G01L 21/30* (2006.01)
*G01R 31/00* (2006.01)

(52) U.S. Cl.
USPC ................................................ 216/59; 216/71

(58) Field of Classification Search
None
See application file for complete search history.

(56) References Cited

U.S. PATENT DOCUMENTS 4,534,816 A 8/1985 Chen et al.
5,904,487 A 5/1999 Conboy et al.
5,919,332 A 7/1999 Koshiishi et al.
5,938,854 A 8/1999 Roth
6,037,017 A * 3/2000 Kashiro ........................ 427/579
6,527,911 B1 3/2003 Yen et al.
6,916,401 B2 7/2005 Long
7,156,950 B2 1/2007 Kim et al.
7,204,913 B1 4/2007 Singh et al.
7,223,699 B2 5/2007 DeOrnellas et al.
2002/0187647 A1 12/2002 Dhindsa et al.
2003/0137250 A1 7/2003 Mitrovic
2005/0173376 A1 8/2005 Donohoe
2005/0271951 A1 12/2005 Kim (Continued)

FOREIGN PATENT DOCUMENTS

EP 0747928 A1 12/1996
JP 54058361 A 5/1979

(Continued)

OTHER PUBLICATIONS

Laermer, F. et al., Bosch Deep Silicon Etching: Improving Uniformity and Etch Rate for Advanced MEMS Applications, 12th IEEE International Conference on Micro Electro Mechanical Systems, pp. 211-216, Jan. 1999.

(Continued)

*Primary Examiner* — Shamim Ahmed
*Assistant Examiner* — Bradford Gates
(74) *Attorney, Agent, or Firm* — Perkins Coie LLP

(57) ABSTRACT

Plasma reactors with adjustable plasma electrodes and associated methods of operation are disclosed herein. The plasma reactors can include a chamber, a workpiece support for holding a microfeature workpiece, and a plasma electrode in the chamber and spaced apart from the workpiece support. The plasma electrode has a first portion and a second portion configured to move relative to the first portion. The first and second portions are configured to electrically generate a plasma between the workpiece support and the plasma electrode.

15 Claims, 10 Drawing Sheets

(56) References Cited

U.S. PATENT DOCUMENTS

| | | | |
|---|---|---|---|
| 2006/0070703 | A1 | 4/2006 | Johnson et al. |
| 2006/0131271 | A1 | 6/2006 | Kiermasz et al. |
| 2006/0278339 | A1 | 12/2006 | Kim et al. |
| 2007/0068795 | A1 | 3/2007 | Brcka |
| 2007/0113979 | A1 | 5/2007 | George et al. |
| 2007/0113981 | A1 | 5/2007 | Brcka |
| 2007/0186855 | A1 | 8/2007 | Dhindsa |
| 2008/0023443 | A1 | 1/2008 | Paterson et al. |
| 2010/0068887 | A1 | 3/2010 | Harrington |

FOREIGN PATENT DOCUMENTS

| | | | |
|---|---|---|---|
| JP | 55072039 | A | 5/1980 |
| JP | 57023227 | A | 2/1982 |
| JP | 57114231 | A | 7/1982 |
| JP | 04052288 | A | 2/1992 |
| JP | 07045542 | A | 2/1995 |
| JP | 08055835 | A | 2/1996 |
| JP | 11067725 | A | 3/1999 |
| JP | 2001007090 | A | 1/2001 |
| JP | 2001053065 | A | 2/2001 |
| JP | 2002359232 | A | 12/2002 |
| JP | 2003229408 | A | 8/2003 |
| KR | 20020080922 | A | 10/2002 |
| KR | 1020050018066 | A | 2/2005 |
| WO | 2006041634 | A2 | 4/2006 |

OTHER PUBLICATIONS

Li, T.C. et al., Two Variables Feedback Control of Plasma Etch Processing, IEEE 34th International Conference on Plasma Science, p. 567, Jun. 2007.

Sekiyama, S. et al., Possibilities and Limitations of SiO2 Etching with Parallel Plate RF Plasma, IEEE/UCS/SEMI International Symposium on Semiconductor Manufacturing, pp. 178-181, Sep. 1995.

Sobolewski, M.A., Real-Time Noninvasive Monitoring of Ion Energy at a Wafer Surface During Plasma Etching, 33rd IEEE International Conference on Plasma Science, IEEE Conference Record—Abstracts, abstract only, p. 472, Jun. 2006.

Wang, S-Q. et al., Plasma Etch Process Diagnosis and Control by Wireless Sensor Wafer in Semiconductor Chip Manufacturing, 8th International Conference on Solid-State and Integrated Circuit Technology, pp. 2175-2180, Oct. 2006.

* cited by examiner

PLASMA REACTOR WITH ADJUSTABLE PLASMA ELECTRODES AND ASSOCIATED METHODS

CROSS-REFERENCE TO RELATED APPLICATION

This application is a divisional of U.S. application Ser. No. 12/210,724 filed Sep. 15, 2008, now U.S. Pat. No. 8,382,941, which is incorporated herein by reference in its entirety.

TECHNICAL FIELD

The present disclosure is directed to plasma reactors and associated methods of operation.

BACKGROUND

Plasma etching is commonly used in semiconductor fabrication for removing material from substrates. FIG. 1 illustrates a plasma reactor 10 in accordance with the prior art. As shown in FIG. 1, the plasma reactor 10 includes a chamber 11, a support 12 inside the chamber 11, and a power source 14 electrically coupled to the support 12. The chamber 11 includes a vessel 16 coupled to an electrically grounded lid 18 to form a sealed environment inside the chamber 11. The chamber 11 also includes a gas inlet 20 proximate to an upper portion of the vessel 16 and a gas outlet 22 proximate to a bottom portion of the vessel 16. The plasma reactor 10 can also include a vacuum pump (not shown) coupled to the gas outlet 22 for evacuating etching gases from the chamber 11.

In operation, an etching gas enters the chamber 11 via the gas inlet 20. The power source 14 creates a bias voltage between the support 12 and the lid 18 to establish and/or to maintain a plasma 24 between the lid 18 and a wafer 28 held on the support 12. The plasma 24 then removes material from a surface of the wafer 28 via chemical, physical, and/or a combination of chemical/physical processes.

One drawback of the foregoing plasma reactor 10 is that the etching uniformity over the surface of the wafer 28 may be difficult to maintain. For example, the plasma 24 may have a non-uniform charge density that can cause the plasma 24 to etch a central portion more rapidly than a peripheral portion of the wafer 28. As a result, feature dimensions in the central portion may be larger than those of the peripheral portion of the wafer 28. Such etching non-uniformity can have a significant impact on subsequent wafer processing and/or final wafer yields. Accordingly, there is a need for a plasma reactor with improved etching uniformity over a wafer.

DETAILED DESCRIPTION

Specific details of several embodiments of the disclosure are described below with reference to plasma reactors having adjustable plasma electrodes and associated methods of operation. The term “microfeature workpiece” is used throughout to include substrates upon which and/or in which microelectronic devices, micromechanical devices, data storage elements, read/write components, and other features are fabricated. A person skilled in the relevant art will also understand that the disclosure may have additional embodiments, and that the disclosure may be practiced without several of the details of the embodiments described below with reference to FIGS. 2A-7.

Figure 4:
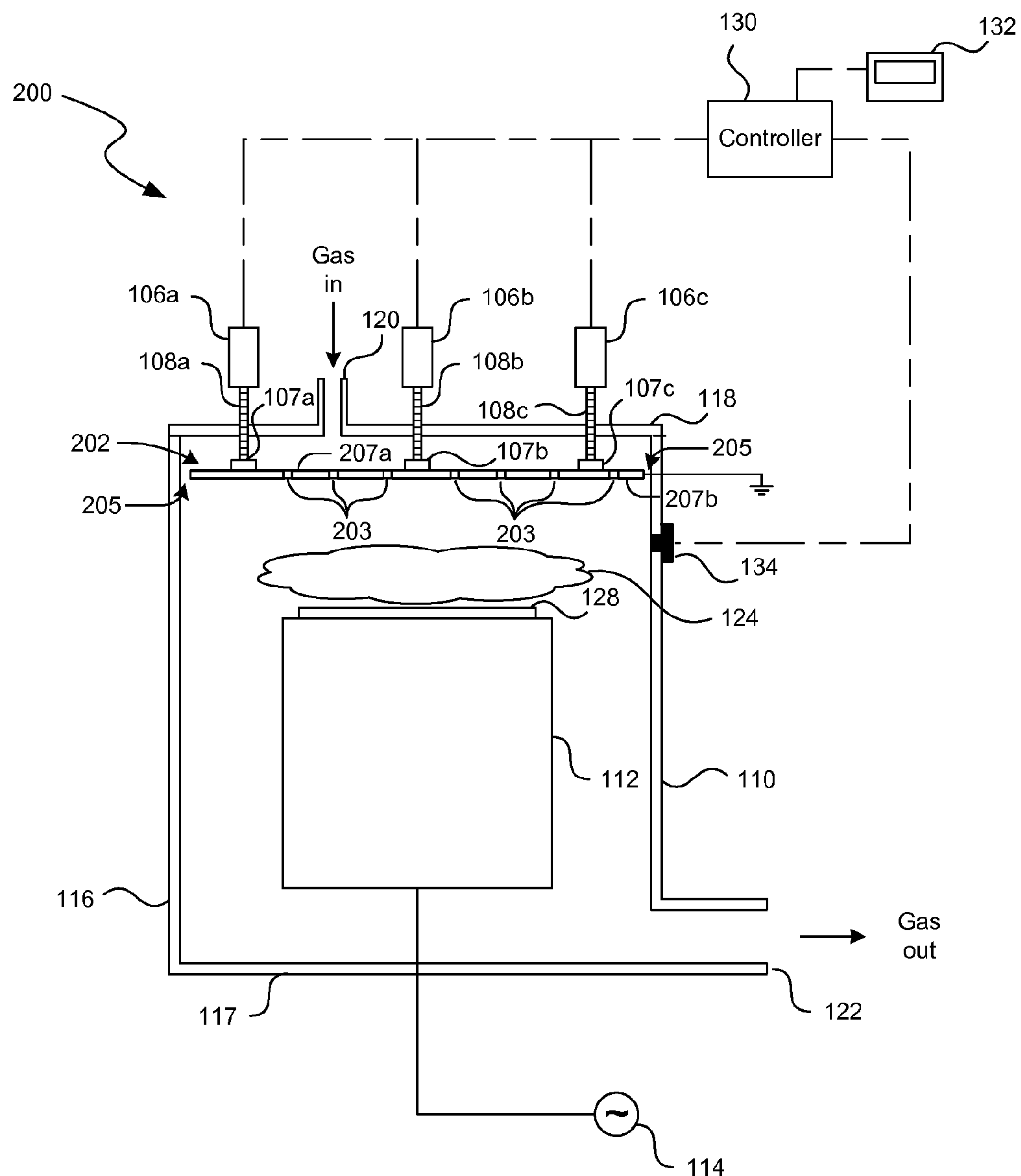
FIG. 4 is a partially schematic cross-sectional view of a plasma reactor having a perforated plasma electrode in accordance with another embodiment of the disclosure.
Figure 5A:
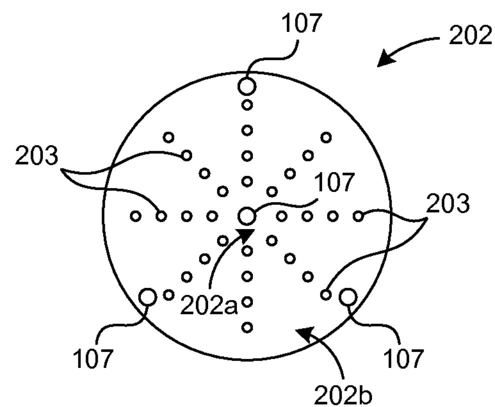
FIGS. 5A-B are plan views of the perforated plasma electrode in FIG. 4 in accordance with several embodiments of the disclosure.
Figure 5B:
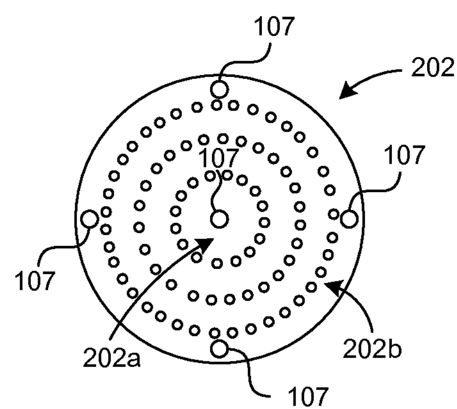
Figure 6:
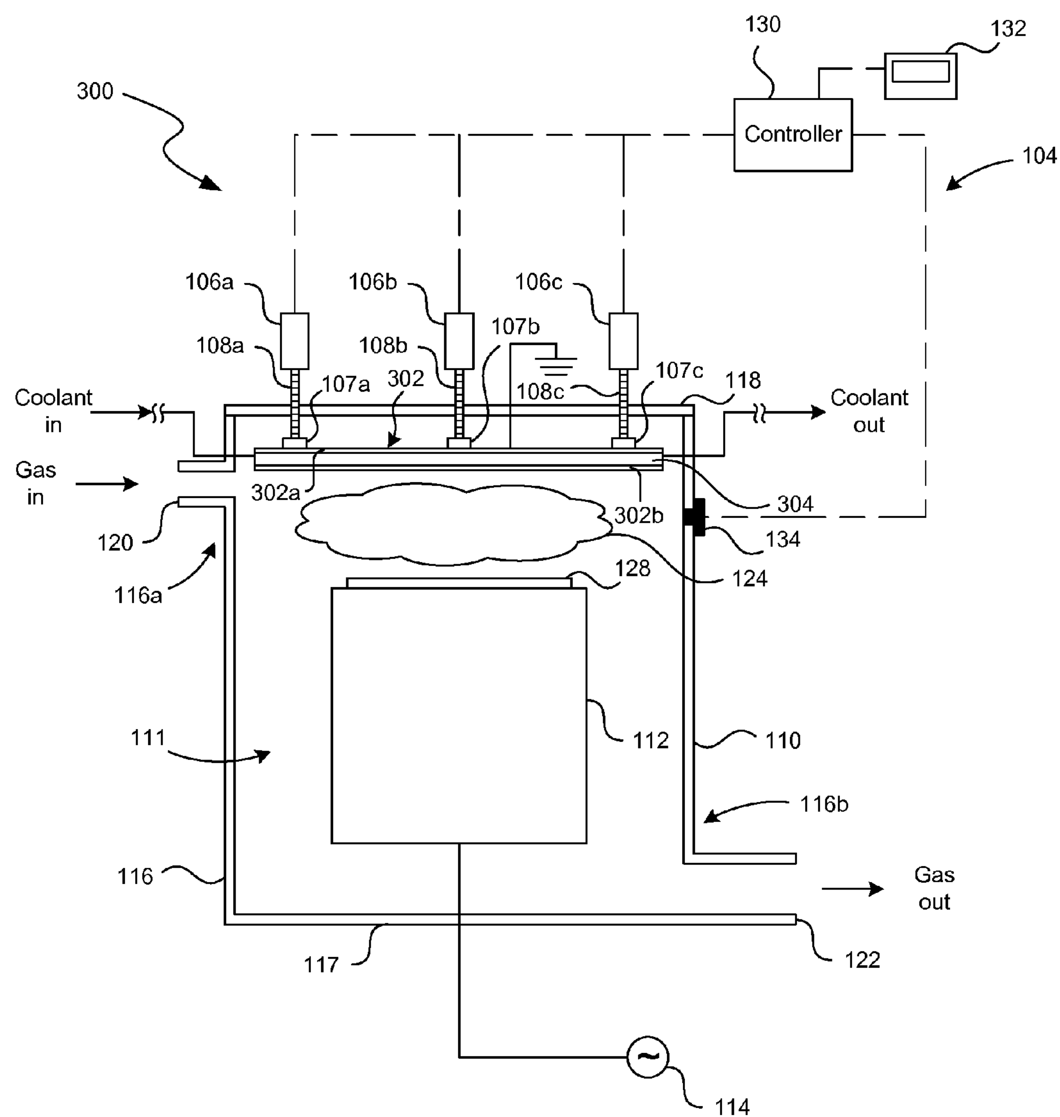
FIG. 6 is a partially schematic cross-sectional view of a plasma reactor having a multilayer plasma electrode in accordance with yet another embodiment of the disclosure.

FIGS. 2A-D illustrate a plasma reactor 100 having an adjustable plasma electrode 102 under various operating conditions, and FIGS. 3A-D illustrate several embodiments of the plasma electrode 102 in FIGS. 2A-D. FIG. 4 illustrates a plasma reactor 200 having a perforated plasma electrode 202, and FIGS. 5A-B illustrate several embodiments of the perforated plasma electrode 202 in FIG. 4. FIG. 6 illustrates a plasma reactor 300 having a multilayer plasma electrode 302. These embodiments and other embodiments described herein can have generally similar components and functions. As a result, common acts and structures are identified by the same reference numbers.

Figure 2A:
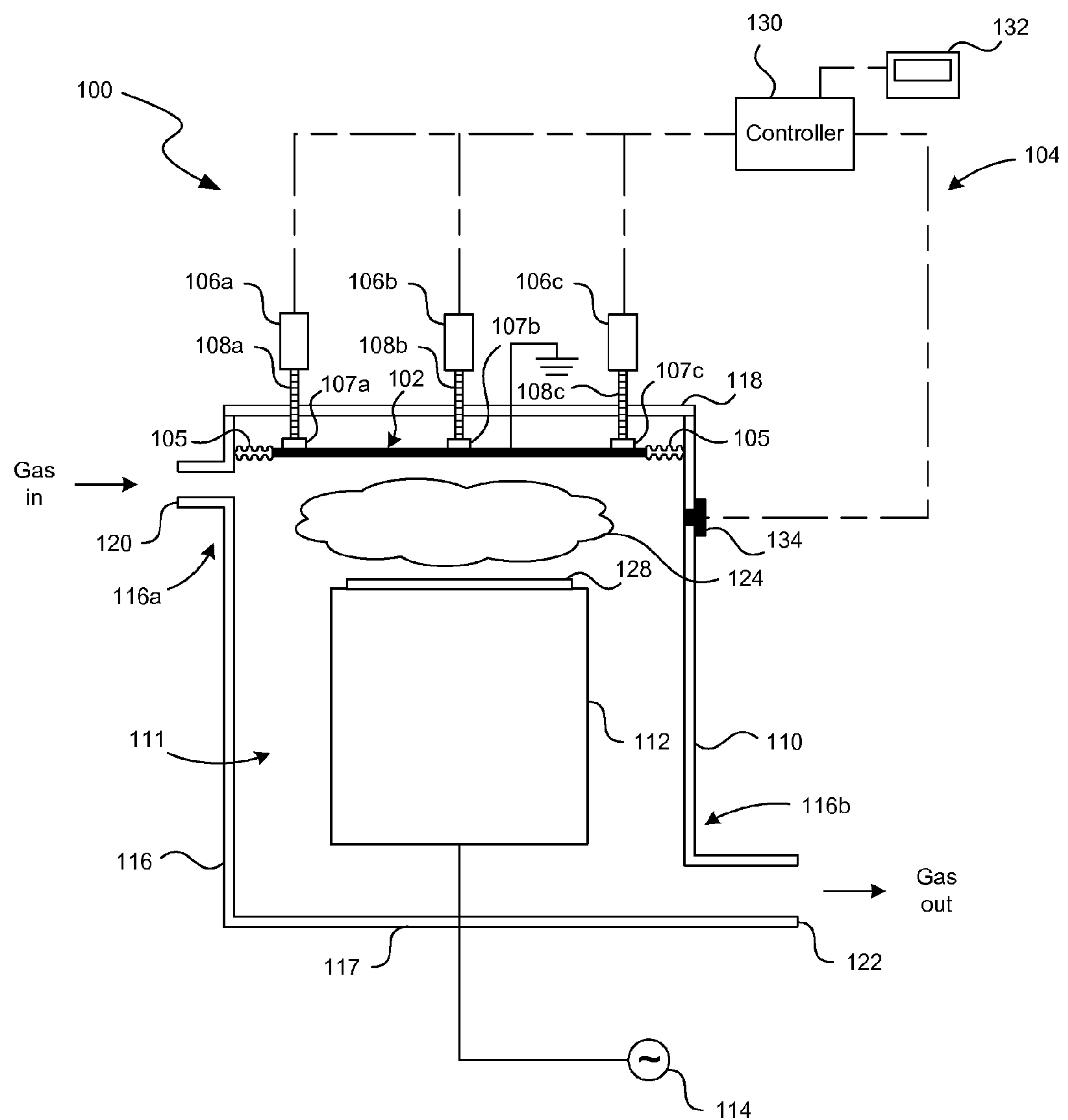
FIG. 2A is a partially schematic cross-sectional view of a plasma reactor having an adjustable plasma electrode in accordance with an embodiment of the disclosure.

FIG. 2A is a partially schematic cross-sectional view of the plasma reactor 100 having the adjustable plasma electrode 102 in accordance with an embodiment of the disclosure. In the illustrated embodiment, the plasma reactor 100 is shown as a capacitively coupled plasma reactor. However, in other embodiments, the plasma reactor 100 can also be an inductively coupled plasma reactor and/or other types of plasma reactor, or the plasma reactor 100 can be used to deposit material onto the wafer.

As shown in FIG. 2A, the plasma reactor 100 includes a chamber 110, a plasma control unit 104, a support 112 inside the chamber 110, and a power source 114 for providing an electrical bias in the chamber 110. The support 112 can include a vacuum chuck, an electrostatic chuck, a mechanical chuck, and/or other suitable device configured to hold a microfeature workpiece 128. The power source 114 can include a direct current source or an alternating current source. In the illustrated embodiment, the chamber 110 includes a vessel 116 coupled to a lid 118 to form a sealed environment 111 inside the chamber 110. The chamber 110 includes a gas inlet 120 proximate to an upper portion 116*a* of the vessel 116 and a gas outlet 122 proximate to a bottom portion 116*b* of the vessel 116. In other embodiments, the chamber 110 can be a unitary structure enclosing the sealed environment 111. In further embodiments, the gas inlet 120 can extend into the chamber 110 through the plasma electrode 102, and/or the gas outlet 122 can extend through the bottom 117 of the chamber 110.

The chamber 110 can contain a suitable etching gas for generating a plasma 124 in the chamber 110 for a particular etching process. For example, tetrafluoromethane, silicon hexafluoride, and nitrogen trifluoride may be used for etching silicon, silicon dioxide, or silicon nitride. Chlorine and dichloro-difluoromethane may be used for etching silicon. Boron trichloride and tetrachloromethane may be used for etching aluminum. In further examples, the etching gas may also include other suitable compounds.

The plasma control unit 104 can include one or more actuating couplers 108 (three are shown for illustration purposes and identified individually as first, second, and third actuating couplers 108*a-c*, respectively) coupling individual actuators 106 (identified individually as first, second, and third actuators 106*a-c*, respectively) to corresponding electrode connectors 107 (identified individually as first, second, and third electrode connectors 107*a-c*, respectively) of the plasma electrode 102. The individual electrode connectors 107 can include a threaded ring, a bolt, a nut, a compression fitting, and/or other suitable connector. The individual actuators 106 can include an electric motor, a pneumatic actuator, and/or other suitable actuating device. The individual actuating couplers 108 can include a lead screw, a coupling shaft, a diaphragm, and/or other suitable coupler. The individual actuators 106 can optionally include position transmitters, limit switches, and/or other components for measuring at least one operational parameter of the actuators 106 and/or the actuating couplers 108. In the illustrated embodiment, the actuating couplers 108 extend through the lid 118 into the sealed environment 111 of the chamber 110. In other embodiments, the actuating couplers 108 and/or the actuators 106 can be disposed inside the chamber 110.

The plasma electrode 102 can be flexible or have flexible portions. For example, a portion of the plasma electrode 102 can be bent, twisted, curved, or bowed relative to at least one other portion to adopt a new shape. In the illustrated embodiment, the plasma electrode 102 includes a plate sized and shaped to fit in the chamber 110. At least a portion of the plate can flex so that one portion of the plate can be displaced relative to another portion of the plate. For example, a central portion of the plate can be offset relative to a peripheral portion of the plate, or a peripheral portion of the plate can be offset relative to another peripheral portion and/or the central portion of the plate. In other embodiments, the plasma electrode 102 can include a disk, a sheet, and/or other suitable structure. In further embodiments, the plasma electrode 102 may include a combination of at least one flexible portion and at least one generally rigid portion. Several embodiments of the plasma electrode 102 are discussed in more detail below with reference to FIGS. 3A-D.

In certain embodiments, the plasma electrode 102 can be constructed from a suitably conductive material that is highly conductive or at least partially conductive. For example, in a capacitively coupled plasma reactor, as shown in FIG. 2A, the plasma electrode 102 can be constructed from a metal (e.g., copper, aluminum, titanium, zinc, gold, and platinum), a metal alloy (e.g., Inconel or Hastelloy), or doped polysilicon. In an inductively coupled plasma reactor, the plasma electrode 102 can be constructed from glass, polymers, ceramics, and/or other non-conductive materials.

The plasma control unit 104 can optionally include a flexible coupler 105 for structurally supporting the plasma electrode 102 while allowing one or more portions of the plasma electrode 102 to move relative to a sidewall of the chamber 110. In the illustrated embodiment, the flexible coupler 105 includes a bellows that connects at least a portion of the periphery of the plasma electrode 102 to the sidewall of the chamber 110. In other embodiments, the flexible coupler 105 can also include a diaphragm, a spring flange, and/or other suitable flexible connector. In further embodiments, the flexible coupler 105 can be omitted.

The plasma control unit 104 can also include at least one plasma monitor 134 for monitoring the plasma 124. The plasma monitor 134 can include a temperature sensor, an electrostatic probe, a mass spectrometer, an optical emission spectrometer, and/or another suitable monitor for measuring at least one parameter indicative of the plasma uniformity in the chamber 110. One suitable plasma monitor 134 includes a plasma sensor (Model No. Plasma Volt) provided by Onwafer Technologies of Santa Clara, Calif.

The plasma control unit 104 can further include a controller 130 operatively coupled to the actuators 106, the plasma monitor 134, and a display 132. The controller 130 can include a process logic controller, a system logic controller, or any other suitable logic controller having a computer-readable medium containing instructions to adjust an output to one or more of the actuators 106 based on the parameter measured by the plasma monitor 134. Software modules of the controller 130 are described in more detail below with reference to FIG. 7.

In operation, the etching gas is injected into the chamber 110 via the gas inlet 120 while the plasma electrode 102 is grounded and the power source 114 applies a bias voltage to the microfeature workpiece 128 via the support 112. The bias voltage between the plasma electrode 102 and the microfeature workpiece 128 generates and/or maintains the plasma 124 that deposits/removes material on/from the microfeature workpiece 128. In certain embodiments, the plasma electrode 102 may be powered. In other embodiments, the plasma electrode 102 may be grounded or otherwise not powered. During operation, the plasma monitor 134 can continuously measure at least one plasma parameter (e.g., a plasma charge density and/or a plasma temperature) of the plasma 124 in the chamber 110. The actuators 106 can optionally provide a current position of the actuating couplers 108, a current output level of the actuators 106, and/or other operational parameters of the actuators 106 and/or the actuating couplers 108 to the controller 130. The controller 130 then receives the plasma parameter and the optional operational parameters of the actuators 106 and/or the actuating couplers 108 and determines the plasma uniformity based on the collected data.

Figure 2B:
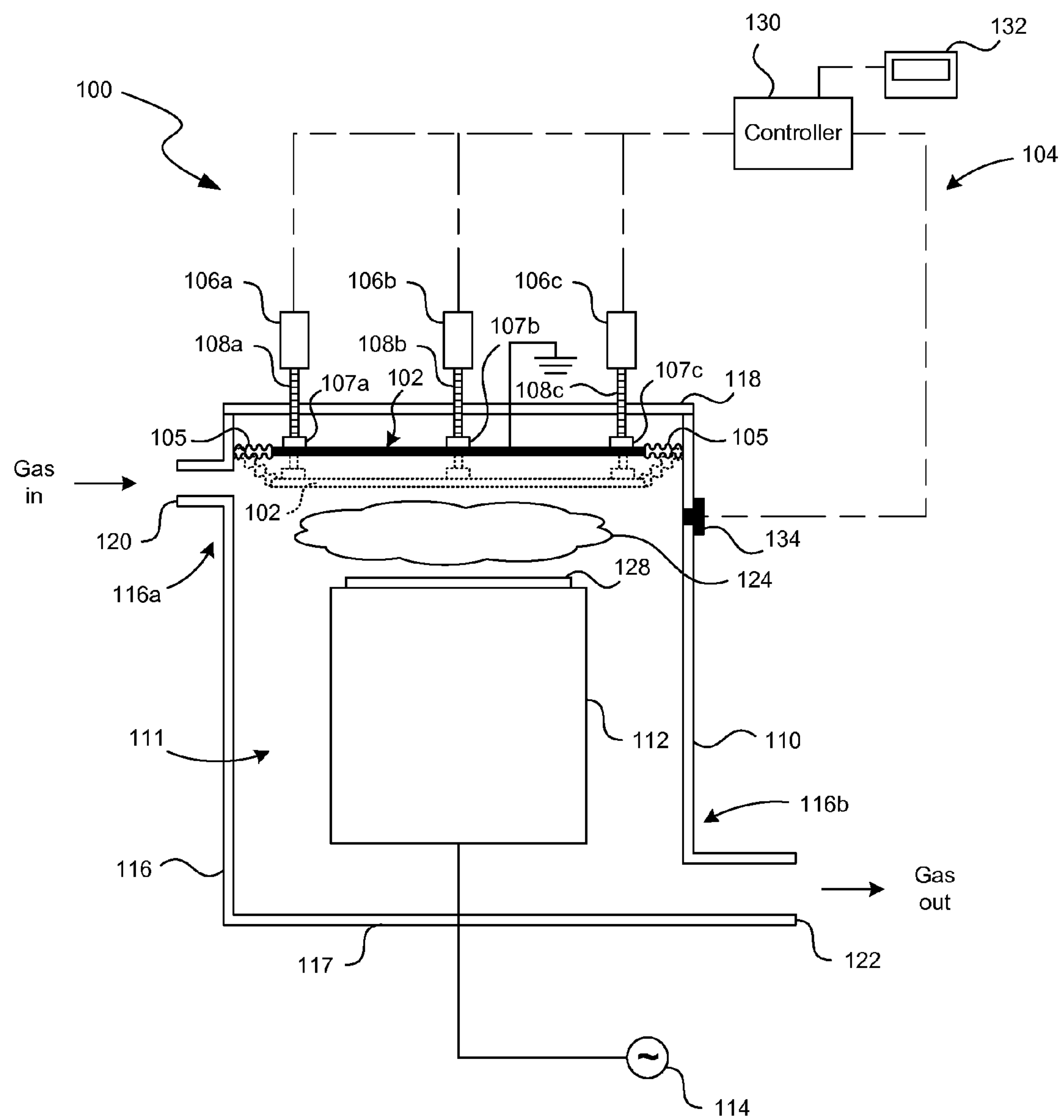
FIGS. 2B-D are partially schematic cross-sectional views of the plasma reactor in FIG. 2A under various operating conditions.
Figure 2C:
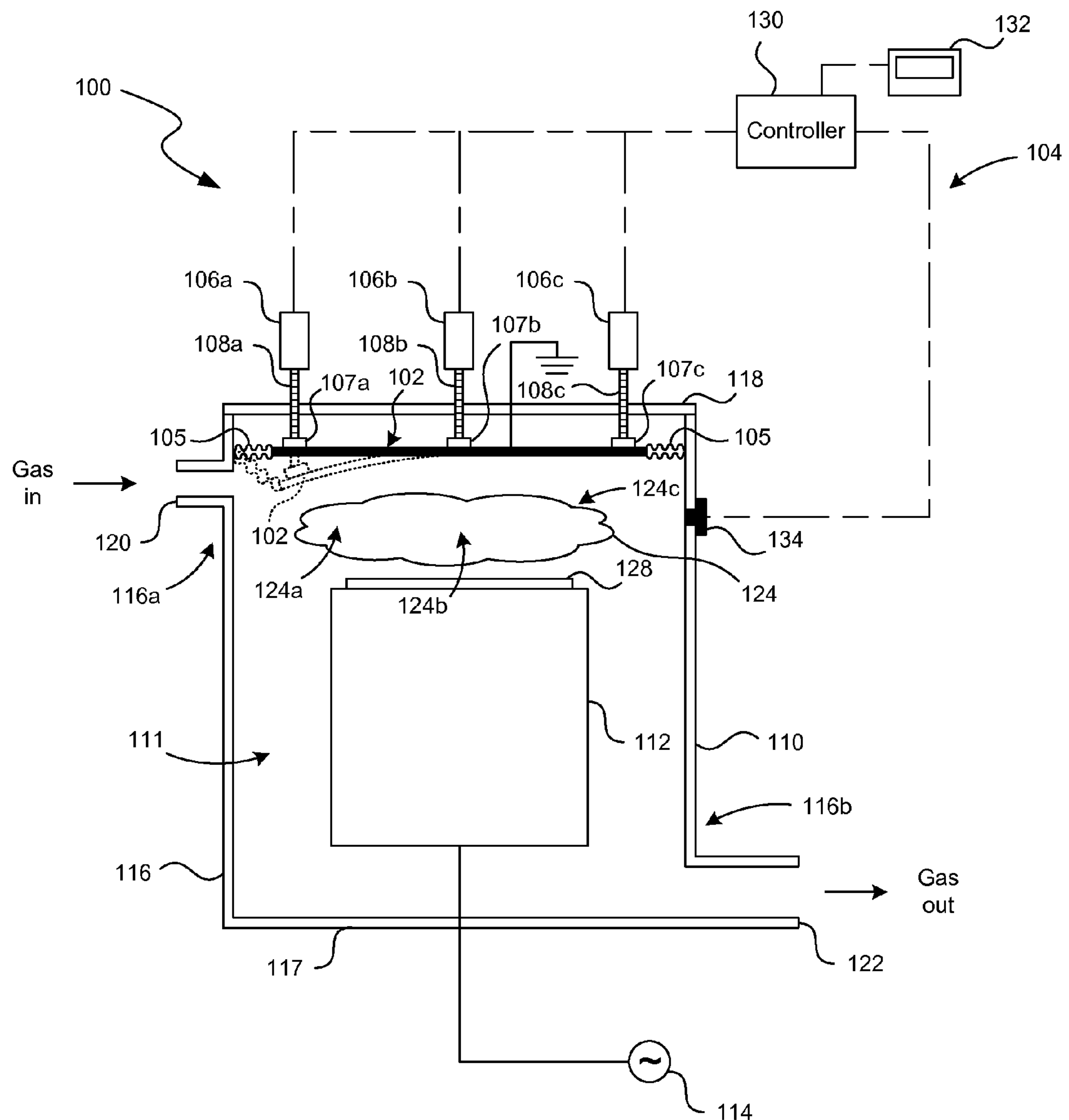
Figure 2D:
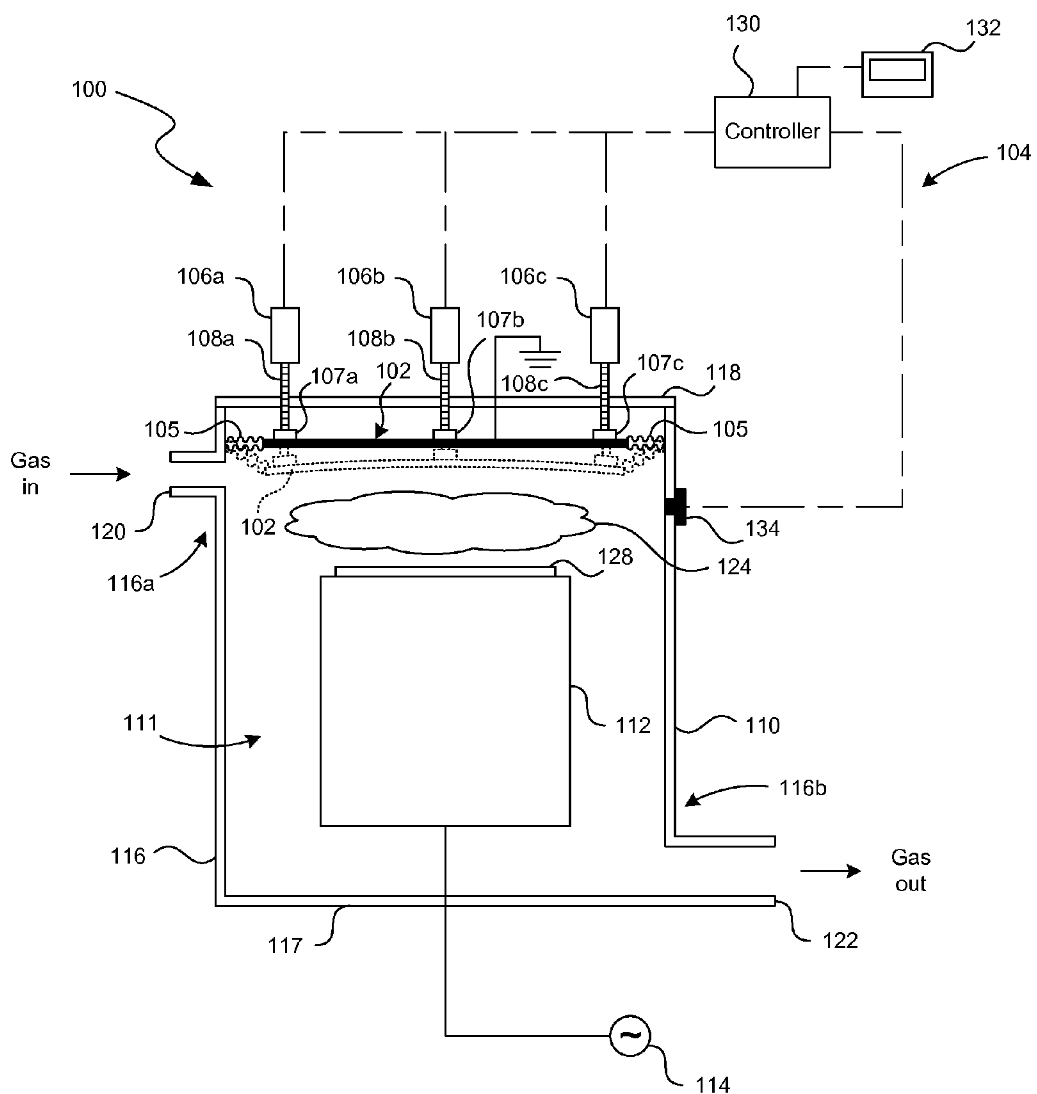

The controller 130 can then transmit output signals to at least one of the actuators 106 to adjust the shape and/or position of the plasma electrode 102 based on the received plasma parameter to improve the plasma uniformity. For example, as shown in FIG. 2B, the controller 130 can cause all of the actuators 106 to extend the actuating couplers 108 toward the microfeature workpiece 128 by approximately the same distance. As a result, a plasma gap between the microfeature workpiece 128 and the plasma electrode 102 can be uniformly reduced. In another example, as shown in FIG. 2C, the controller 130 can cause only the first actuating coupler 108*a* to extend toward the microfeature workpiece 128. As a result, a portion of the plasma electrode 102 corresponding to the first electrode connector 107*a* flexes to be closer to the microfeature workpiece 128 than other portions of the plasma electrode 102. In yet another example, as shown in FIG. 2D, the controller 130 can cause all of the actuators 106 to extend the actuating couplers 108 toward the microfeature workpiece 128 but for different distances. As a result, the overall plasma gap can be reduced while the shape of the plasma electrode 102 is modified. In further examples, the controller 130 may selectively cause any other combinations of the actuators 106 to move transversely relative to the microfeature workpiece 128 for any desired distances.

It is recognized that by appropriately adjusting the plasma and/or the shape of the plasma electrode 102, the control of the plasma in the chamber 110 can be improved. For example, referring to FIG. 2C, if the measured data from the plasma monitor 134 indicate that a first plasma portion 124*a* has a lower plasma charge density than a second and third plasma portions 124*b-c*, the controller 130 can cause the first actuator 106*a* to extend the first actuating coupler 108*a* toward the microfeature workpiece 128 such that the plasma gap corresponding to the first plasma portion 124*a* is reduced. Without being bound by theory, it is believed that the reduced plasma gap can increase the plasma charge density in the first plasma portion 124*a* such that all portions of the plasma 124 can be generally uniform. The plasma can accordingly be controlled so that it is more uniform relative to the surface of the wafer.

Figure 1:
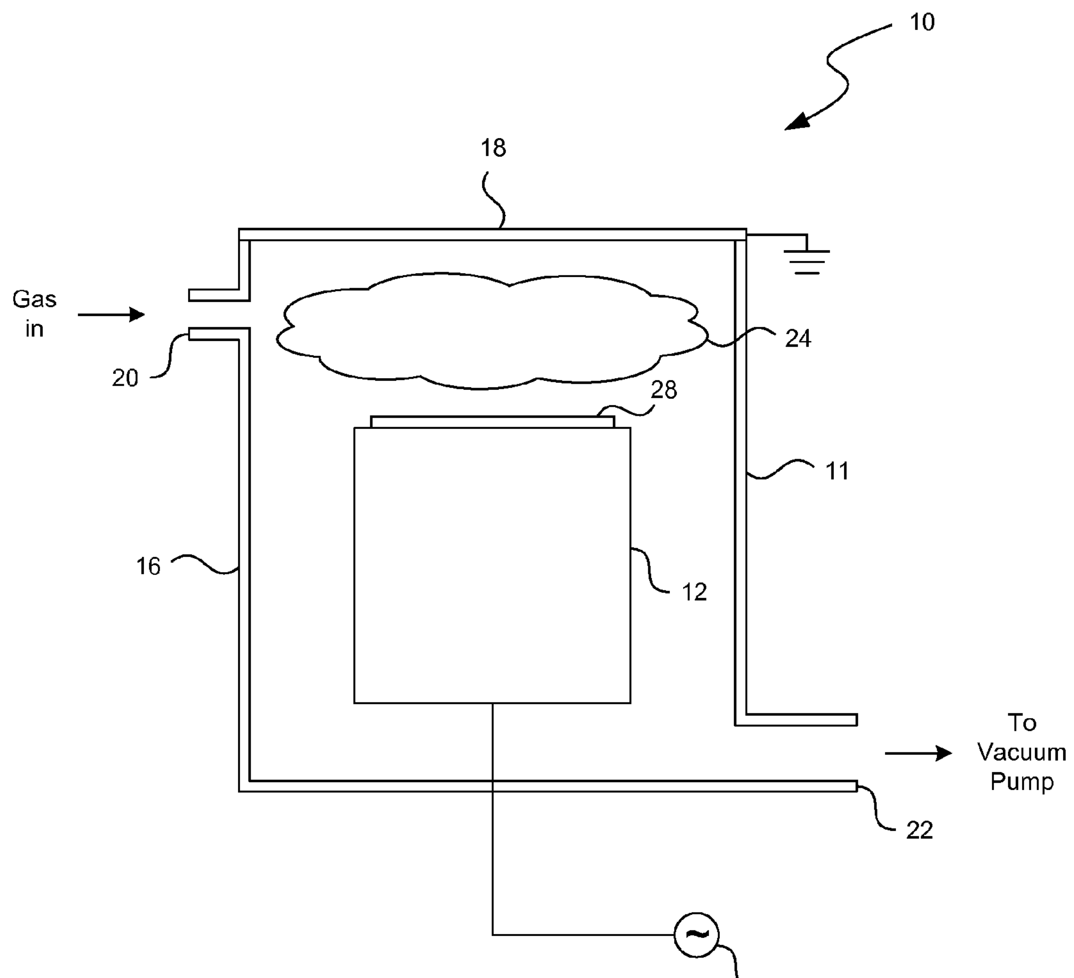
FIG. 1 is a partially schematic cross-sectional view of a plasma reactor in accordance with the prior art.

Several embodiments of the plasma reactor 100 can have improved etching uniformity than conventional plasma reactors (e.g., the plasma reactor 10 in FIG. 1). A first conventional technique for controlling plasma uniformity includes manually adjusting the plasma gap, e.g., by elevating the support 12 relative to the lid 18 (FIG. 1). A second conventional technique includes providing a custom fixed-shape plasma electrode to compensate for inherent characteristics of the plasma reactor. However, both of these techniques have drawbacks. For example, adjusting the plasma gap typically does not improve the etching uniformity between a central region and a peripheral region of a workpiece. A custom fixed-shape plasma electrode can only compensate for the inherent characteristics for certain etching processes, but not for other processes that may be performed in the reactor. As a result, the adjustable plasma electrode 102 and the actuators 106 can dynamically control both the plasma gap and the shape of the plasma electrode 102 either before, during, or after a deposition/etching process to improve the uniformity or otherwise control the plasma in the plasma reactor 100.

Even though the plasma electrode 102 in FIGS. 2A-D is shown to be electrically grounded, in certain embodiments, the plasma electrode 102 can be electrically biased by, e.g., being coupled to the power source 114 while the support 112 is grounded or to another power source. In other embodiments, both the plasma electrode 102 and the support 112 may be electrically biased. In further embodiments, the plasma reactor 100 can also include valve assemblies (not shown) for supplying the etching gas to the chamber 110, a vacuum pump (not shown) coupled to the gas outlet 122, a radio-frequency power source proximate to the chamber 110, and/or other suitable process equipment. Further, in certain embodiments, the action of the controller 130 may also be based at least in part on empirical data (e.g., etching uniformity on a test substrate) and/or other process parameters instead of or in addition to the reactive feedback from the plasma monitor 134. In other embodiments, the actuators 106 may also transmit positional information of the actuating couplers 108 to the controller 130.

Figure 3A:
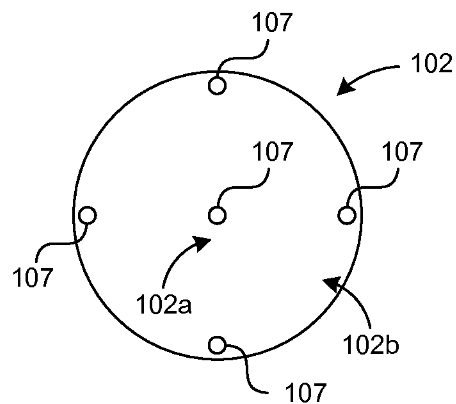
FIGS. 3A-D are plan views of the adjustable plasma electrode in FIG. 2A in accordance with several embodiments of the disclosure.
Figure 3B:
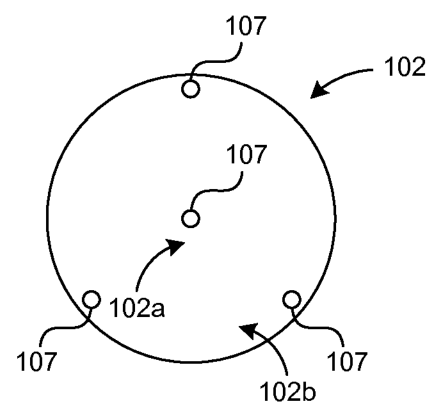
Figure 3C:
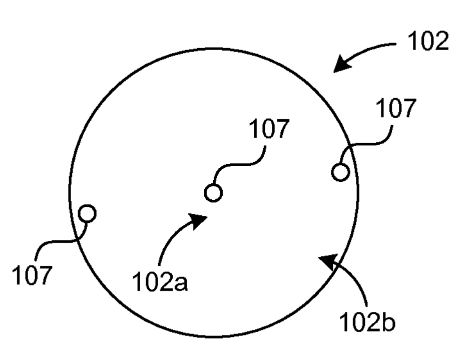
Figure 3D:
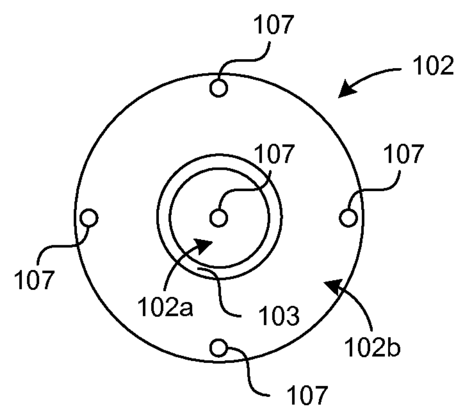

FIGS. 3A-D are plan views of examples of the plasma electrode 102 in FIGS. 2A-D in accordance with several embodiments of the disclosure. In one embodiment, as shown in FIG. 3A, the plasma electrode 102 can include a generally circular plate having one electrode connector 107 in a central region 102*a* and four electrode connectors 107 in a peripheral region 102*b* of the plasma electrode 102. The peripheral electrode connectors 107 are generally equal angularly spaced apart from one another. In other embodiments, the plasma electrode 102 can include fewer or more peripheral electrode connectors 107. For example, as shown in FIG. 3B, the plasma electrode 102 can include three peripheral electrode connectors 107. As shown in FIG. 3C, the plasma electrode 102 can include two peripheral electrode connectors 107. In further embodiments, the plasma electrode 102 can include any desired number of electrode connectors 107 in any suitable arrangement for an etching process. FIG. 3D illustrates another embodiment in which the control region 102*a* and the peripheral region 102*b* of the plate are separate components connected together by a flexible joint 103. The joint 103 can be conductive, or the joint 103 can be a flexible dielectric material such that the control region 102*a* can be biased at a different potential than the peripheral region 102*b*. In yet further embodiments, the plasma electrode 102 can include a plate that has any desired geometric shape and dimension and any desired number of electrode connectors 107 on the plate in any desired arrangement.

FIG. 4 is a partially schematic cross-sectional view of a plasma reactor 200 having a perforated plasma electrode 202 in accordance with another embodiment of the disclosure. In the illustrated embodiment, the lid 118 carries the gas inlet 120, and the plasma electrode 202 is positioned between the gas inlet 120 and the support 112. A slit 205 separates the plasma electrode 202 from the sidewall of the chamber 110. The plasma electrode 202 includes a plurality of apertures 203 extending from a first surface 207*a* to a second surface 207*b*. The first and second surfaces 207*a-b* are opposite of each other. In certain embodiments, the apertures 203 extend generally perpendicularly to the first or second surface 207*a-b*. In other embodiments, at least a portion of the apertures 203 can be canted relative to the first or second surface 207*a-b*. In further embodiments, the plasma electrode 202 can also include channels and/or other types of perforation. In yet other embodiments, the slit 205 can be omitted, and the plasma electrode 202 can be directly coupled to the sidewall of the chamber 110.

The operation of the plasma reactor 200 can be generally similar to the plasma reactor 100 of FIGS. 2A-D except that the apertures 203 of the plasma electrode 202 can distribute the etching gas in the chamber 110. Several embodiments of the plasma reactor 200 can thus further improve the plasma uniformity in the chamber 110 because of the improved distribution of the etching gas over the microfeature workpiece 128.

FIGS. 5A-B are plan views of the plasma electrode 202 in FIG. 4 in accordance with several embodiments of the disclosure. In one embodiment, as shown in FIG. 5A, the plasma electrode 202 includes a generally circular plate having an electrode connector 107 in a central region 202*a* and three electrode connectors 107 in a peripheral region 202*b* of the plasma electrode 202. The plasma electrode 202 also has a plurality of apertures 203 arranged in linear arrays extending radially from the central region 202*a* to the peripheral region 202*b*. In another embodiment, as shown in FIG. 5B, the apertures 203 can also be arranged in generally circular arrays extending radially from the central region 202*a* to the peripheral region 202*b*. In further embodiments, the plasma electrode 202 can include any desired number of electrode connectors 107 and/or apertures 203 arranged in any desired pattern.

FIG. 6 is a partially schematic cross-sectional view of a plasma reactor 300 having a multilayer and adjustable plasma electrode 302 in accordance with yet another embodiment of the disclosure. As shown in FIG. 6, the plasma electrode 302 includes a first layer 302*a* spaced apart from a second layer 302*b* by an internal space 304. The plasma reactor 300 can also include a coolant supply (not shown) in fluid communication with the internal space 304 for cooling the plasma electrode 302 during operation. Suitable coolant can include water, glycol, oil, and/or other suitable heat exchange medium.

Figure 7:
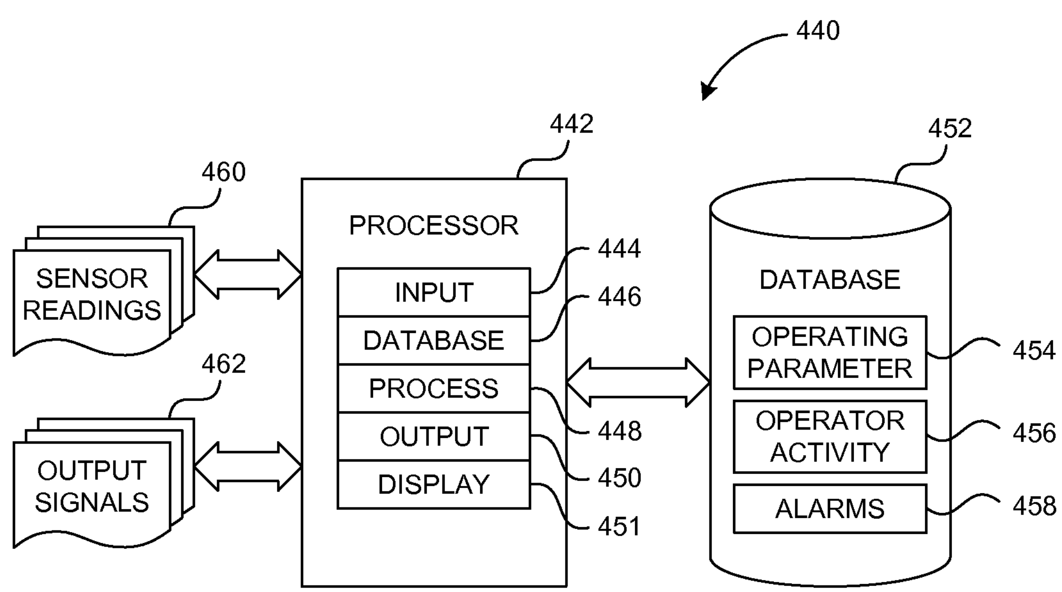
FIG. 7 is a block diagram showing computing system software modules for controlling a plasma reactor in accordance with an embodiment of the disclosure.

FIG. 7 illustrates a functional block diagram showing software modules 440 suitable for use in the controller 130 (FIG. 2A). Each component can be a computer program, procedure, or process written as source code in a conventional programming language, e.g., the C++ programming language, and can be presented for execution by the CPU of a processor 442. The various implementations of the source code and object and byte codes can be stored on a computer-readable storage medium. The modules of the processor 442 can include an input module 444, a database module 446, a process module 448, an output module 450, and optionally, a display module 451. In another embodiment, the software modules 440 can be presented for execution by the CPU of a network server in a distributed computing scheme.

In operation, the input module 444 accepts an operator input, such as a process setpoint (e.g., a threshold value for plasma uniformity) and control selections (e.g., enable/disable a system device), and communicates the accepted information or selections to other components for further processing. The database module 446 organizes records, including an operating parameter 454, an operator activity 456, and alarms 458, and facilitates storing and retrieving of these records to and from a database 452. Any type of database organization can be utilized, including a flat file system, hierarchical database, relational database, or distributed database, such as provided by Oracle Corporation, Redwood Shores, Calif.

The process module 448 generates control variables based on sensor readings 460 obtained from the plasma monitor 134 and/or the actuators 106 (FIG. 2A). For example, in one embodiment, the process module 448 includes a computation routine for calculating an average, an arithmetic deviation, a standard deviation, and/or other statistics of the plasma charge density at a cross-sectional area in the chamber 110 (FIG. 2A). The process module 448 can also include a condition routine for determining whether the plasma is uniform in the chamber 110 by, e.g., deciding whether any or a combination of the calculated plasma statistics exceeds a predetermined threshold. If the condition routine indicates that the plasma is not uniform in the chamber 110, the process module 448 can further include an action routine for generating control variables for the output module 450. For example, the action routine may include a proportional-integral-derivative (PID) logics for computing a value for the plasma gap in the chamber 110 based on, e.g., the variations in the plasma charge density. The action routine may also include look-up table logics for determining a particular actuator 106 that corresponds to the determined plasma non-uniformity.

The output module 450 generates output signals 462 based on the control variables. For example, the output module 450 can convert the generated control variables from the process module 448 into 4-20 mA output signals 462 suitable for a direct current voltage modulator of the actuators 106. The processor 442 optionally can include the display module 451 for displaying, printing, or downloading the sensor readings 460 and the output signals 462 via devices such as the display 132 (FIG. 2A). A suitable display module 451 can be a video driver that enables the processor 442 to display the sensor readings 460 on the display 132.

From the foregoing, it will be appreciated that specific embodiments of the disclosure have been described herein for purposes of illustration, but that various modifications may be made without deviating from the disclosure. For example, many of the elements of one embodiment may be combined with other embodiments in addition to or in lieu of the elements of the other embodiments. Accordingly, the disclosure is not limited except as by the appended claims.

I claim:

1. A method for operating a plasma reactor, comprising:
injecting an etching gas into a chamber having a plasma electrode spaced apart from a support holding a microfeature workpiece, wherein the plasma electrode has a first portion and a second portion configured to move relative to the first portion, and wherein a flexible coupler connects the plasma electrode to a sidewall of the chamber allowing the first and the second portions of the electrode to move relative to the sidewall;
generating a plasma between the plasma electrode and the microfeature workpiece from the etching gas; and
adjusting a shape of the plasma electrode by moving at least one of the first and the second portions of the electrode relative to the sidewall.

2. The method of claim 1, further comprising monitoring a plasma uniformity of the generated plasma, and wherein adjusting a shape of the plasma electrode includes adjusting a shape of the plasma electrode based on the monitored plasma uniformity.

3. The method of claim 1 wherein adjusting a shape of the plasma electrode includes flexing a portion of the plasma electrode relative to at least one other portion of the plasma electrode.

4. The method of claim 1 wherein adjusting a shape of the plasma electrode includes reducing a first distance between a first portion of the plasma electrode and the microfeature workpiece while having a second distance between a second portion of the plasma electrode relative to the microfeature workpiece.

5. The method of claim 1 wherein adjusting a shape of the plasma electrode includes adjusting a shape of the plasma electrode dynamically while generating the plasma between the plasma electrode and the microfeature workpiece from the etching gas.

6. The method of claim 1 wherein adjusting a shape of the plasma electrode includes adjusting a shape of the plasma electrode continuously while generating the plasma between the plasma electrode and the microfeature workpiece from the etching gas.

7. The method of claim 1 wherein adjusting a shape of the plasma electrode includes adjusting a shape of the plasma electrode before or after generating the plasma between the plasma electrode and the microfeature workpiece from the etching gas.

8. The method of claim 1 wherein adjusting a shape of the plasma electrode includes adjusting a shape of the plasma electrode based on a predetermined parameter of the plasma.

9. A method for operating a plasma reactor, comprising:
injecting an etching gas into a chamber having a plasma electrode spaced apart from a support holding a microfeature workpiece;
generating a plasma between the plasma electrode and the microfeature workpiece from the etching gas; and
adjusting a distance of the plasma electrode from the microfeature workpiece by moving the plasma electrode with an actuator, wherein a flexible coupler connects the plasma electrode to a sidewall of the chamber allowing the plasma electrode to move relative to the sidewall.

10. The method of claim 9 wherein the plasma electrode has a first portion and a second portion configured to move relative to the first portion.

11. The method of claim 10 wherein adjusting a distance of the plasma electrode includes adjusting a first distance between the first portion of the plasma electrode and the microfeature workpiece while having a second distance between the second portion of the plasma electrode and the microfeature workpiece generally unchanged.

12. The method of claim 10 wherein the first portion of the plasma electrode is a central portion of the plasma electrode and the second portion of the plasma electrode is a peripheral portion of the plasma electrode, and wherein the central portion and the peripheral portion are connected with a flexible joint.

13. The method of claim 12 wherein the flexible joint is made of a flexible dielectric material.

14. The method of claim 10 wherein the first portion of the plasma electrode carries a plurality of electrode connectors.

15. The method of claim 14 wherein the electrode connectors are generally equally angularly spaced apart.

* * * * *